US007015453B2

(12) United States Patent
Ogura et al.

(10) Patent No.: US 7,015,453 B2
(45) Date of Patent: Mar. 21, 2006

(54) PHOTODETECTOR

(75) Inventors: Mutsuo Ogura, Tsukuba (JP); Yasushi Nagamune, Tsukuba (JP); Takeyoshi Sugaya, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 10/889,125

(22) Filed: Jul. 13, 2004

(65) Prior Publication Data
US 2005/0151061 A1    Jul. 14, 2005

(30) Foreign Application Priority Data
Jan. 13, 2004    (JP) .............................. 2004-005580

(51) Int. Cl.
*H01L 29/06*    (2006.01)

(52) U.S. Cl. .................... 250/214.1; 257/184; 257/622

(58) Field of Classification Search ............. 250/214.1, 250/200; 257/184, 187, 188, 194, 243, 244, 257/290, 292, 622, 627
See application file for complete search history.

(56) References Cited

U.S. PATENT DOCUMENTS

| 4,989,052 A | * | 1/1991 | Okada et al. ............... 257/194 |
| 6,753,593 B1 | * | 6/2004 | Jefferson et al. ............ 257/627 |
| 2004/0061103 A1 | * | 4/2004 | Kendall ........................ 257/30 |

FOREIGN PATENT DOCUMENTS

JP    9-260711    10/1997

OTHER PUBLICATIONS

A. J. Shields, et al., "Detection of single photons using a field-effect transistor gated by a layer of quantum dots", Applied Physics Letters, vol. 76, No. 25, Jun. 19, 2000.
Masashi Shima, et al., "Random telegraph signals of tetrahedral-shaped recess field-effect transistor memory cell with a hole-trapping floating quantum dot gate", Applied Physics Letters, vol. 77, No. 3, Jul. 17, 2000.
Akira Fujiwara, et al., "Detection of single charges and their generation-recombination dynamics in Si nanowires at room temperature", Applied Physics Letters, vol. 80, No. 24, Jun. 17, 2002.

* cited by examiner

*Primary Examiner*—Kevin Pyo
(74) *Attorney, Agent, or Firm*—Oblon, Spivak, McClelland, Maier & Neustadt, P.C.

(57)    ABSTRACT

Quantum wire is formed on the bottom of a V-shaped groove in a V-grooved substrate as a channel between source and drain electrodes or as at least part of the channel. A photocarrier accumulation region is provided within the quantum wire or at a position connected to or adjacent to the quantum wire for accumulating charges generated when light shines onto a photosensitive region that comprises at least a clad layer that covers the quantum wire. A recess is provided in the upper clad layer to localize the photocarrier accumulation region. As a result, it is possible to provide a photodetector that exhibits high sensitivity, high speed and low power consumption in an expanded wavelength region. It is also possible to provide a photodetector capable of constructing core portions thereof by one-time selective growth.

6 Claims, 6 Drawing Sheets

PHOTODETECTOR

BACKGROUND OF THE INVENTION

1. Field of the Invention

The present invention relates to a photodetector used to detect very weak optical signals. More specifically, the invention relates to an ultra-high sensitivity, high-performance, high-speed and low-power consumption photodetector that operates in the ultraviolet, visible and infrared regions, which are important in the fields of scientific instruments, telecommunications and general consumer products.

2. Description of the Prior Art

The various designs for photodetectors may be categorized into photodiodes in which photocarriers at a semiconductor photosurface are simply transformed into photocurrent, avalanche photodiodes in which photocarriers are accelerated and multiplied, photo-FETs in which photocarriers are accumulated underneath the gate regions and amplified, and photo-multiplier tubes in which photoelectrons are multiplied. The silicon photodiode is most suitable and less expensive in the spectra range of 0.4 to 1.0 $\mu$m for use in scientific measurements. In contrast, photo-multiplier tubes have been used for ultraviolet region, and photo-multiplier tubes or InGaAs photodiodes have been used for infrared region. However, photo-multiplier tubes are bulky and cannot be made into arrays. They also need high voltage power supplies. Photodiodes need sense amplifiers which induce additional electronic noise, and their S/N (signal-to-noise) ratio is low.

For high-sensitivity physical measurement of such wavelengths, devices are frequently cooled down to prevent degradation of sensitivity induced by a thermal noise, which causes additional complexity in the apparatus and increased production costs. Accumulation of photocarriers by long-term exposure is another method of improving the S/N ratio that is commonly applied in silicon CCDs (charge-coupled devices). However, this cannot improve the S/N ratio in short exposure times.

In contrast, the avalanche photodiode and PIN diode are commonly used in telecommunication systems. The avalanche photodiode has a multiplication effect and is so sensitive that single photon detection is possible at cryogenic temperatures. However, 1 G bit/s has been the maximum bit rate, limited by the recovery time from the avalanche multiplication of the photogenerated electrons. For current communication systems which require a detection rate of more than 10 G bit/s, an optical signal is first amplified with an optical fiber amplifier and detected with an even faster PIN photodetector in a complex system. Such complexity is inevitable in the system with the PIN diode because the quantum efficiency of the PIN diode is physically limited to 1 (approximately 1 A/W): one photon generates only one pair of electron and hole.

For such reasons, a high-speed and highly sensitive photodetector with a response speed greater than 10 GHz and with a multiplication effect is necessary for optical communication systems. Single photon detection with a count rate greater than 100 MHz is another requirement to realize a quantum-cryptographic communication system.

Phototransistors are also produced for generaluse equipment as position sensors and optical power monitors with response speeds of 1 microsecond. In conventional phototransistors, photogenerated carriers are accumulated in the base region of the bipolar transistor and effectively change the base current of the transistor. Similarly in the MOS FET, photogenerated carriers are accumulated underneath the gate region and modulate the majority current, and this phenomenon is effectively employed for the photodetectors with the multiplication effect. They are called 'photo-MOS FET' and widely used for optically isolated relays. That is, amplification is realized by accumulating the photogenerated charge and reading out as a majority carrier current of the FET. Although some instability in the current is induced by the fluctuation of the accumulated carrier location, the problems of reading amplifier noise and parasitic capacitor have been avoided. Sensitivity and speed generally have a reciprocal relationship. That is, the response speed deteriorates as the sensitivity increases. In the extreme case, persistent photoconductivity due to deep levels occurs at cryogenic temperatures in the GaAs/AlGaAs FET. Its sensitivity goes up close to infinity, although it is not easy to control its performance. Improving both sensitivity and response speed is a difficult task in general. However, micro-fabrication techniques can effectively reduce the device's capacitance and resistance and improve its performance.

Now that single photon detectors and single photon emitters must operate at a relatively high speed of 100 MHz, the phototransistor is promising as the structural foundation for expanding the range of operating wavelengths, and also achieving dramatic improvements in integration, sensitivity, response speeds and reduced power consumption. The following studies are related to the above demands for expanded operating wavelengths, increased sensitivity, higher speeds and lower power consumption.

(a) Non-patent reference document 1: A. J. Shields, M. P. Ritchie, R. A. Hogg, M. L. Leadbeater, C. E. Norman, and M. Pepper, "Detection of single photons using a field-effect transistor gated by a layer of quantum dots," Appl. Phys. Lett. Vol. 76, No. 25, (June 2000) 3673–3675.). Here, single photons are detected from the compound semiconductor modulation doped FET with quantum dots formed between the channel and gate electrode.

(b) Non-patent reference document 2: Masashi Shima, Yoshiki Sakuma, Yuji Awano, and Naoki Yokoyama, "Random telegraph signals of tetrahedral-shaped recess field-effect transistor memory cell with a hole-trapping floating quantum dot gate," Appl. Phys. Lett. Vol. 77, No. 3, (2000) 441–443.) Here, a single charge memory device is disclosed using a quantum dot at the bottom of a tetrahedral recess as a charge accumulation layer and an adjacent quantum well at the side wall as a charge detection FET, respectively.

(c) JP-A HEI 9-260711. Here, a constricted electron channel is formed in a modulation doped structure either by gate electrodes or regrowth of semi-insulating layers, and the accumulation of holes in the constricted channel realizes high-sensitivity photodetectors.

(d) Non-patent reference document 3: Akira Fujiwara, Kenji Yamazaki, and Yasuo Takahashi, "Detection of single charges and their generation-recombination dynamics in Si nanowires at room temperature," Appl. Physics Lett. Vol. 76, No. 25, (June 2000) 3673." This paper suggests that quantum wire is sensitive as a single-charge detector.

In the device disclosed in non-patent reference document 1, detection of induced charge is inefficient because the conducting channel of the FET is two-dimensional.

In non-patent reference document 2, although it is advantageous that charge accumulation and charge read out regions are constructed three-dimensionally, the use of oblique side walls on the higher-order substrate restricts the selection of constituent materials, limits circuit design, and causes high power dissipation in the read-out FET due to poor electron mobility along the channel.

In JP-A HEI 9-260711, it is difficult to reduce the size of the constricted electron channel in the modulation doped structure less than 0.1 micron either by gate electrodes or regrowth of semi-insulating layers, although concept of the structure is desirable. Large parasitic capacitance becomes an obstacle for the high speed operation of photodetectors as well. The regrowth process induces interface defects especially in the aluminum containing materials, such as AlGaAs, which cause instability in device operation.

The device disclosed in non-patent reference document 3 is immature as a practical device, although it carries new possibilities for silicon based photodetectors.

The present invention has as its object to realize a new, high-sensitivity, wide spectral range and low power consumption photodetector with low production costs, by employing one-time selective growth.

SUMMARY OF THE INVENTION

The photodetector according to the present invention comprises quantum wire formed on the bottom of a V-shaped groove in a V-grooved substrate as a channel between source and drain electrodes, or as at least part of the channel; a photosensitive region comprising at least a clad layer that covers the quantum wire; and a photocarrier accumulation region provided within the quantum wire or at a position connected to or adjacent to the quantum wire for accumulating photocarriers (minority carriers: holes or electrons) generated when light shines onto the photosensitive region.

This aforementioned photosensitive region is comprised of clad layers and quantum well layers extending from both sides of the quantum wire along the side walls of the V-groove. In such configuration, photocarriers are accumulated effectively into preferably one particular point of the quantum wire or adjacent region by optimizing the thickness and composition and their spatial distribution in the upper and lower clad layers and quantum well layers. For example, the photocarrier accumulation region is effectively localized at an intersection between a recess at the upper clad layer and the quantum wire underneath.

The photocarrier accumulation region is also achieved either inside of the quantum wire or at a position connected to or adjacent to the quantum wire where quantum dots are provided. In such case, the presence of the quantum well layers is desirable.

Further, when constituting only a porttion of the channel between the source and drain electrodes of quantum wire, a portion between one end of the quantum wire and the source electrode and a portion between the other end of the quantum wire and the drain electrode comprise a quantum well layer that gradually widens from the ends of the quantum wire until reaching the corresponding respective electrodes.

Further, this invention includes a variation of a photodetector in which a ridge quantum wire of a cross sectional shape as if it should be formed at a ridge top is employed as a channel instead of or in addition to using the quantum wire as the channel.

Because the photosensitive region and charge detection FET are separated in the photodetector embodied in this invention, optimal design can be pursued at the respective regions. High speed and high sensitive detection of photogenerated carriers is achieved by the reduction of channel length and channel width.

This photodetector has an advantage of avoiding exogenous noise because the photosensitive region and charge detection FET are interconnected each other inside of the device structure. Cryogenic operation is favorable for high sensitive photon detection by increasing the photogenerated electron-hole recombination lifetime.

DESCRIPTION OF THE PREFERRED EMBODIMENTS

Figure 1A:
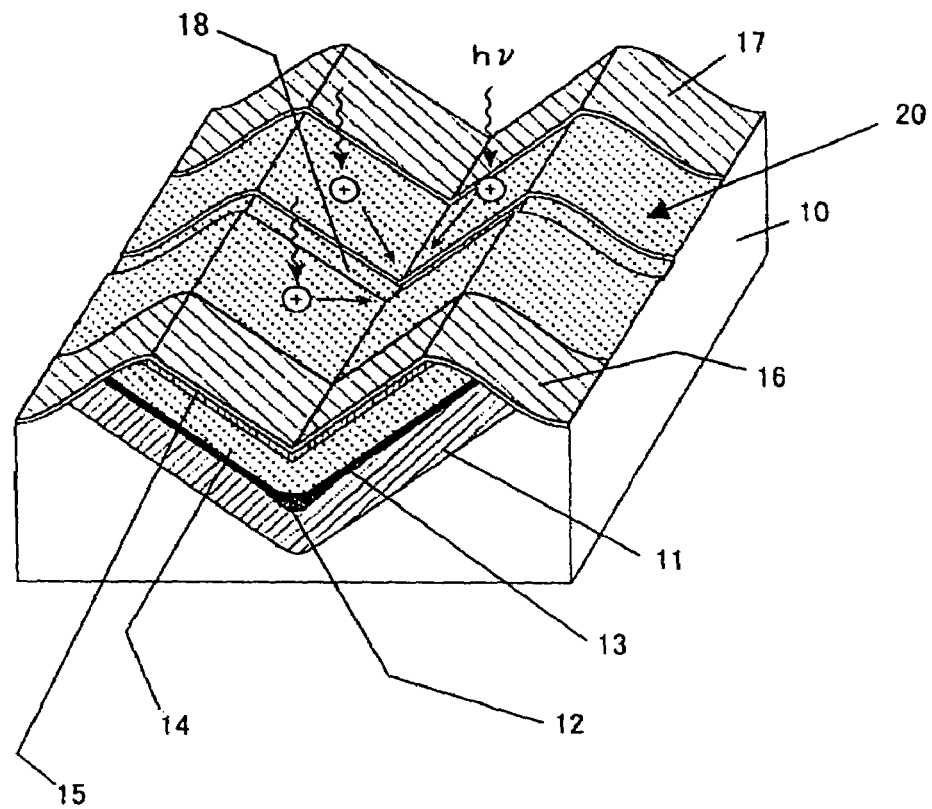
FIG. 1(A) is a schematic structural diagram of one embodiment of the photodetector according to the present invention.

FIG. 1(A) shows the schematic structure of one embodiment of a photodetector constituted according to the present invention. In this case, the V-grooved substrate 10 is assumed to have been made by forming a V-shaped groove in a GaAs or InP substrate. A known method of forming such a V-shaped groove may be used; for example, by forming a 0.2–2 $\mu$m resist pattern in the [0–10] orientation upon a (100) GaAs substrate and then using an aqueous ammonia-hydrogen peroxide solution (ammonia:hydrogen peroxide:water=1:3:50) or the like to perform wet etching with high dependence on the crystal orientation.

This V-grooved substrate 10 is sequentially subjected to a series of operations. For example, a single run of MOCVD deposition can be used to form: an undoped AlGaAs lower clad layer 11, a GaAs or InGaAs quantum wire 12, an intervening undoped AlGaAs spacer layer (not shown), a silicon-doped AlGaAs upper clad layer 14, and a silicon-doped GaAs cap layer 15. Here, the deposition temperature is preferably between 600° C. and 700° C., the lower clad layer 11 is preferably 0.5–1 $\mu$m thick and the quantum wire 12 is preferably 5–20 nm thick. During deposition under these conditions, an oblique quantum well layer 13 is also formed on the groove side walls (oblique walls) such that it is in contact with the quantum wire 12 formed at the bottom of the V-shaped groove.

This oblique quantum well layer 13 must be considerably thinner than the quantum wire 12, but conditions under which it too can be fabricated to several nm or less can be obtained experimentally, but at this time, the flow-rate modulation method that controls the ratio of thicknesses of the oblique quantum well layer and quantum wire 12 at the bottom disclosed in JP-A HEI 10-64825 can be advantageously applied.

The quantum wire 12 serves as the channel of the FET, with a source electrode 16 and drain electrode 17 being formed at either end of the channel in the lengthwise direction, by providing ohmic electrodes consisting of AuGe/Ni/Au, for example. Thereafter, alloying may be performed for roughly 1 minute at 400° C., for example. Then, recess etching is performed in the central portion of the exposed upper clad layer 14 between the source and drain to provide a recess (groove) 18, so that no current flows in the portion of the quantum wire underneath the recess in the dark. While not shown in the diagram, a Schottky electrode consisting of a metal or transparent electrode or a doped-layer electrode may be formed to hold the pinch-off state as a field-effect transistor.

With the device according to this Embodiment, the quantum wire 12 constituting the entire channel between the source and drain has the relatively narrowest energy band gap, giving a structure wherein this quantum wire 12 is sandwiched between the lower and upper clad layers 11 and 14 which have relatively wider energy band gaps. In addition, the portion of the quantum wire 12 below the recess 18 exhibits no change in the band gap, but rather the state is such that the entire energy level is lifted up slightly.

Thus, when light is shined upon the device, photocarriers (electrons and holes) are generated upon the entire photosensitive region, which is in the device according to this embodiment of the present invention, namely the elements of the upper clad layer 14, oblique quantum well layer 13, and in certain cases the lower clad layer 11, which effectively constitute a photoelectric transducer 20 between the source and drain region. Moreover, the holes among the photogenerated photocarriers are transported directly or via the oblique quantum well layer 13, which has a narrow energy band gap than the clad layers, and ultimately to the quantum wire 12 which has the lowest energy level. At this time, the surface depletion layer due to the presence of the recess 18 formed to the appropriate depth and the voltage applied to the Schottky gate (not shown) if provided form in advance a negative static potential, and thus the positive holes accumulate in the portion of the quantum wire 12 underneath the recess 18. As long as these holes are present, the same effect as when the gate bias of an ordinary FET is changed occurs, so the current of electrons which are the majority carriers continues to flow. Specifically, in this preferred embodiment, the portion of the quantum wire 12 underneath the recess 18 becomes a particularly dominant photocarrier accumulation region, thus constituting a localized photocarrier accumulation region. Note that the photogenerated electrons are immediately absorbed into the majority electron carriers. Note that if the quantum wire is p-type, then the potential applied to the Schottky gate is reversed and thus the holes and electrons exchange roles in the above.

With this structure of the device, a combination of three functions is obtained: the generation of holes upon illumination with light, accumulation of holes ultimately in the center of the quantum wire 12, and detection of charge with a current amplifier. Moreover, this structure can be achieved with a device that can be formed by employing self-organizing, one-time selective growth on a non-planar substrate.

Moreover, if the lower and upper clad layers 11 and 14 are fabricated such that the band gap is graded narrower towards the quantum wire 12 and quantum well layer 13, then it is possible to generate an internal built-in electric field to drive holes to the quantum well layer 13 and quantum wire 12. Note that at this time, the quantum well layer also acts as a hole transport layer.

In addition, if a gate electrode is formed using a metal or transparent electrode or a doped layer not shown based on the ordinary FET structure, then after a photoinduced current is detected, a positive gate bias is applied to discharge the holes from underneath the gate (or atop the gate in the case of a back gate), thus permitting the response speed to be increased. Note that possible materials for the quantum wire 12 and oblique quantum well layer 13 include the aforementioned AlGaAs/GaAs combination which is sensitive up to a wavelength of 900 nm, along with an AlGaAs/InGaAs quantum wire upon an GaAs substrate which is sensitive up to a wavelength of roughly 1.2 $\mu$m, an AlInAs/InGaAs quantum wire upon an InP substrate which is sensitive up to a wavelength of roughly 1.5 $\mu$m, or even InGaAs/InGaAs quantum wires of different compositions, but to list only the typical combinations, the following combinations are possible:

(1) GaAs for the substrate 10, InGaAs for the quantum wire 12 and quantum well layer 13, and AlGaAs for the clad layers 11 and 14.

(2) GaAs for the substrate, InGaAs for the quantum wire 12 and quantum well layer 13, and GaAs for the clad layers 11 and 14.

(3) GaAs for the substrate, InGaAs for the quantum wire 12 and quantum well layer 13, and a structure where the Al content gradually decreases from AlGaAs to GaAs for the clad layers 11 and 14.

(4) GaAs for the substrate, InGaAs for the quantum wire 12 and quantum well layer 13, and InGaP for the clad layers 11 and 14.

(5) InP for the substrate, InGaAs for the quantum wire 12 and quantum well layer 13, and InAlGaAs for the clad layers 11 and 14.

(6) InP for the substrate, InGaAs for the quantum wire 12 and quantum well layer 13, and a structure where the Al content gradually decreases from InAlGaAs to InGaAs for the clad layers 11 and 14.

(7) InP for the substrate, InGaAs for the quantum wire 12 and quantum well layer 13, and InGaAsP for the clad layers 11 and 14.

(8) InP for the substrate, InGaAs for the quantum wire 12 and quantum well layer 13, and InP for the clad layers 11 and 14.

(9) InP for the substrate, InGaAs for the quantum wire 12 and quantum well layer 13, and a structure where the As content gradually decreases from InGaAsP to InP for the clad layers 11 and 14.

(10) GaSb for the substrate, GaSb for the quantum wire 12 and quantum well layer 13, and AlGaSbAs for the clad layers 11 and 14.

In addition, cases in which the lower and upper clad layers 11 and 14 have laminated structures consisting of a plurality of materials including $\delta$-doped layers or the like in between, for example, are also conceivable. This is also applicable to the other embodiments of the present invention to be described below.

Figure 1B:
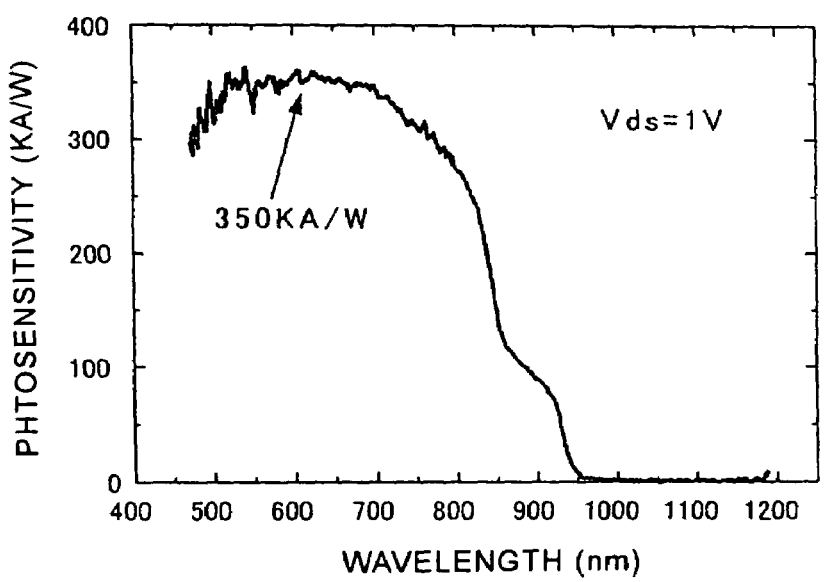
FIG. 1(B) is an example of a graph of the response of the photodetector shown in FIG. 1(A).

In an actual device constructed according to this basic structure of the present invention, the effect of a single photocarrier becomes extremely large. Specifically, the photosensitivity is markedly increased. As a result, with an experimental device built using the materials listed in (5) above, we succeeded in obtaining extremely desirable results as shown in FIG. 1(B). When the drain-source voltage was $V_{ds}=1$ V, the room-temperature photosensitivity reached 350 kA/W near a wavelength of 600 nm. The response of this device was faster than 50 µs despite this high sensitivity, so there was virtually no decrease in response speed accompanying an increase in sensitivity. Moreover, the noise-equivalent power was good at less than 80 aW/√Hz. On the other hand, while this is also illustrated by the other preferred embodiments to be described below, the quantum wire channel 12 formed at the bottom of the V groove need not be only a single channel, but rather a plurality of channels may be provided in parallel. Specifically, when looking at the end surface cross section shown in FIG. 1(A), the device can be given a saw-toothed cross section. This further increases the sensitivity.

In addition, with respect to the long-wavelength regions, by using combinations of materials other than those listed above and varying the manufacturing parameters, examples of experiments that have given sensitivity up to the infrared region have been obtained, although the absolute value of photosensitivity may drop from that given above. However, if one attempts to adopt a manufacturing method suited to optimizing the device, then there are cases wherein it is better for the surface of the upper clad layer 14 between the source and drain electrodes to be not completely exposed but rather covered with a thin cap layer 15, and the sensitivity at that time may also drop slightly. In this case also, there are also cases in which exposing the recess 18 portion is desirable.

Figure 2:
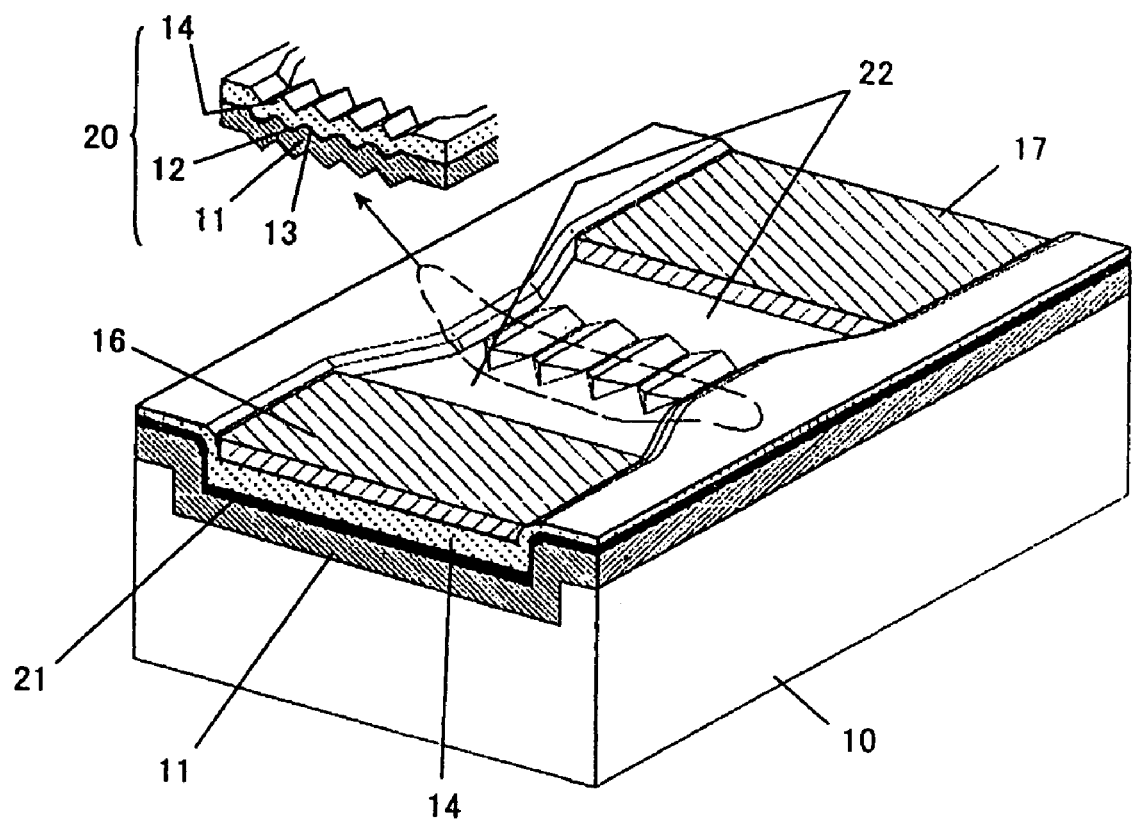
FIG. 2 is a schematic structural diagram of another embodiment of the photodetector according to the present invention.

FIG. 2 illustrates another embodiment of the photodetector of the present invention. In the embodiment of FIG. 1(A), the embodiment illustrated in this FIG. 2 along with the other figures, the same symbols in each figure indicates constituent elements that may be identical or similar. In the device illustrated in this FIG. 2, not only the quantum wire 12 but the photoelectric transducer 20 with a structure essentially the same as that provided between the source and drain of the device shown in FIG. 1(A) is provided in only one portion of the channel between the source electrode 16 and the drain electrode 17. In addition, a plurality of quantum wires 12 is provided in parallel (although only one is sufficient). Moreover, the source ends and drain ends of these quantum-wire channels 12 are each connected via channels consisting of a quantum well 21 in a smooth, flat, widened area 22 to the source electrode 16 and drain electrode 17, respectively. Specifically, by shortening the channel length in the photoelectric transducer (photogenerated charge detection area) 20, the parasitic capacitance and resistance of the device can be reduced and even higher speed operation can be achieved. On the other hand, the response speed can be increased and the power consumption lowered by reducing the resistance through the ohmic electrode by the presence of the widened area 22.

This shape itself is not difficult to fabricate by using known techniques. For example, in the photoresist pattern formed upon the GaAs substrate, by gradually expanding the width from both ends of a rectangular striped shape several µm long and 1–2 µm wide, after wet etching the V-groove shape will be widened smoothly and changed to a U-groove shape having a flat center portion, thus fabricating a substrate having a shape that has wedge-shaped connecting areas when viewed in the plane. Next, when MOCVD selective deposition is used to deposit an undoped AlGaAs clad layer, GaAs layer, and modulation doped AlGaAs layer, a short quantum wire 12 is formed upon the V groove and both ends are widened gradually and connected to the quantum well 21. In more detail, by adopting such a structure, the ohmic resistance is decreased due to the increased surface area of contact between the electrodes 16 and 17 and the electron gas, the transmittance of electron waves is increased due to the smooth connection of both ends of the quantum wire 12 to the quantum well 21, the probability of scattering of electrons due to running through the quantum wire is decreased and the transit time is shortened by the adoption of a short channel, among other achievements. This improves the performance of a quantum-wire FET that works as a charge sense amplifier.

As described above, even one quantum wire 12 may be provided but using a plurality of parallel wires as in the figure is advantageous. Moreover, not only will this increase sensitivity, but the coupling between the optical fiber and high-speed photodetector is more favorable at a light detector size of several dozen to several hundred microns which is somewhat larger than the diameter of the optical fiber core, so this is also useful in enlarging the light detector surface area. Note that the plurality of parallel wires may be provided in the direction of crystal growth, or this may be stacked together with planar lamination.

Figure 3:
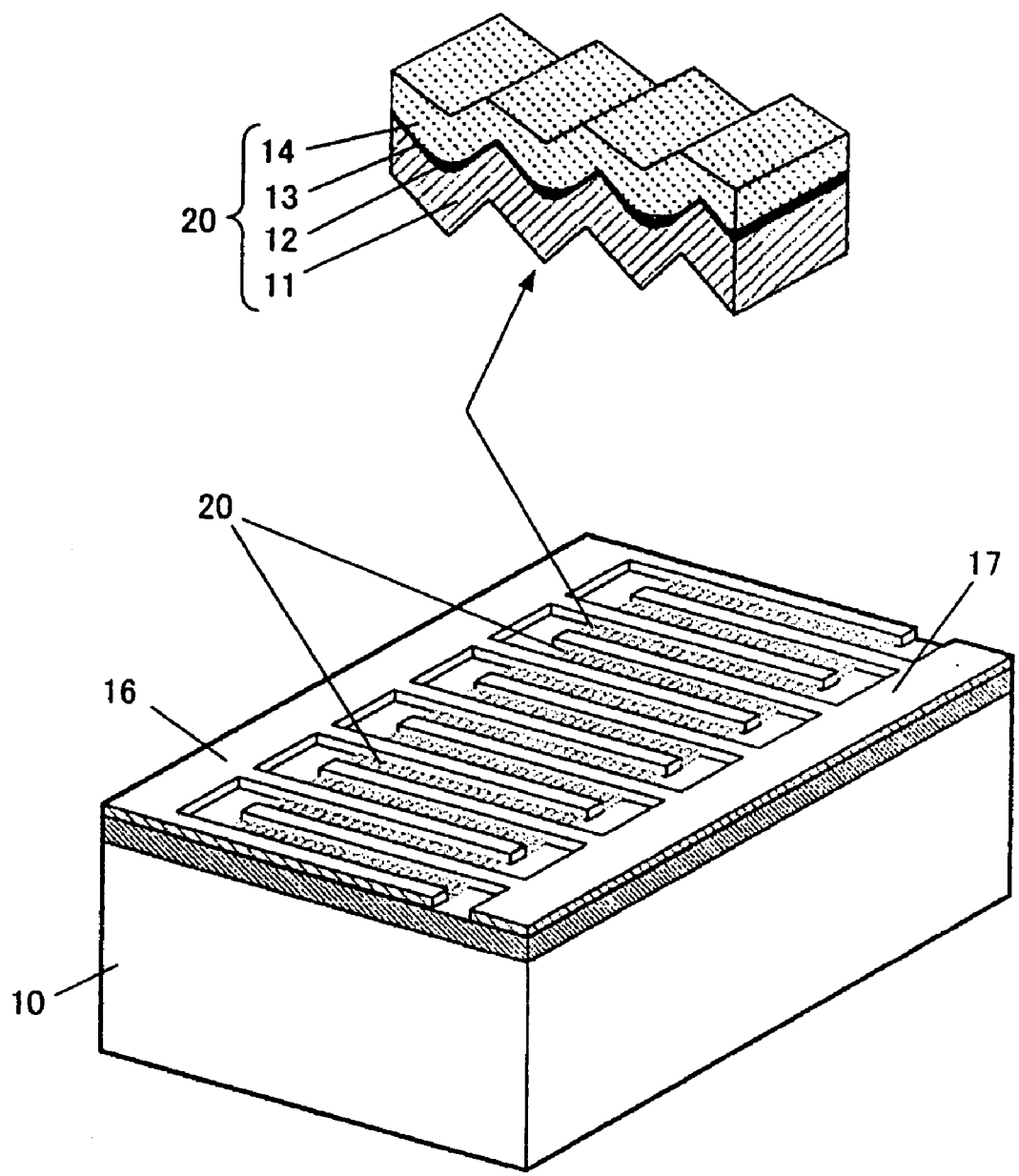
FIG. 3 is a schematic structural diagram of still another embodiment of the photodetector according to the present invention.

If necessary, a device structure, such as that shown in FIG. 3, is also effective in enlarging the surface area of the photoelectric transducer or photosensitive region. Specifically, the structure is such that photoelectric transducers 20 (which may have the same structure as that illustrated in FIG. 2) consisting of a plurality of the portions equivalent to the photoelectric transducer 20 of the device shown in FIG. 1 provided in parallel, which are alternately nested to give an intermeshed comb-shaped source electrode 16 and drain electrode 17. Naturally, the photosensitivity is increased. In addition, based on this structure, if at least the electrode on one side is separated for each element, it is possible to form a photodetector array.

Figure 4:
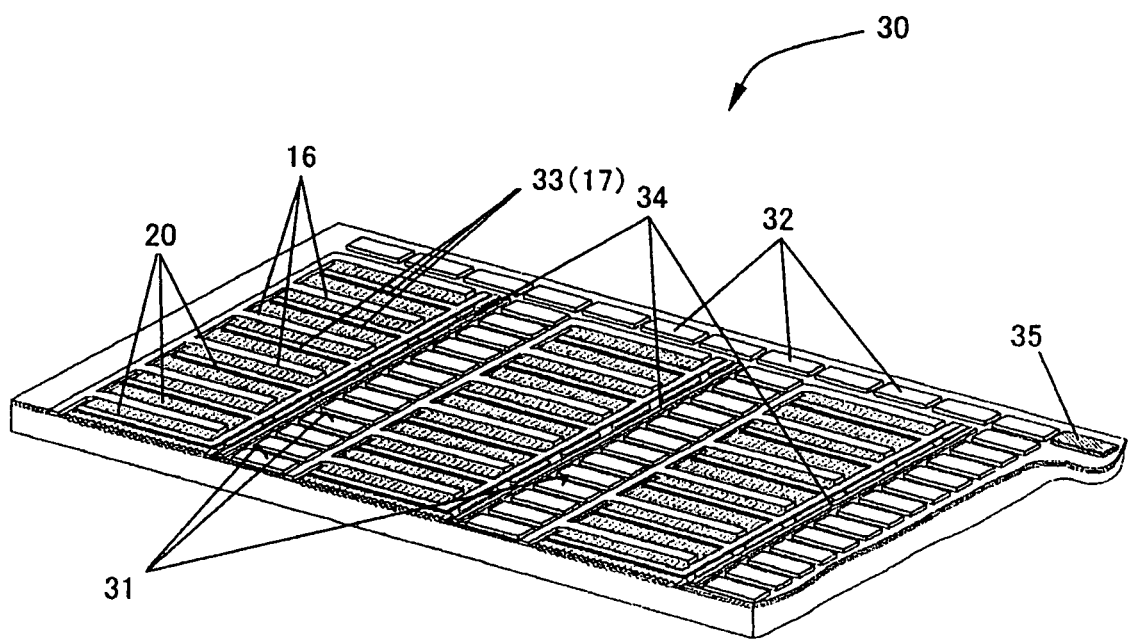
FIG. 4 is a schematic structural diagram of a two-dimensional imaging device incorporating the photodetector according to the present invention.

Moreover, such a parallel structure (which may also be single) can be expanded into a two-dimensional imaging device. FIG. 4 schematically illustrates an example of constructing such a two-dimensional imaging device 30, where the source electrode 16 for each individual photoelectric transducer 20 (which may have the same structure according to the present invention as described above) corresponding to each pixel is put into ohmic contact with the built-in quantum wire channel 12 (not shown in this figure) in the same manner as described previously, but the drain electrode 17 is replaced by a charge accumulation region consisting of a Schottky electrode 33 connected to a vertical CCD 31 through a shift gate 34. This vertical CCD 31 itself may have an existing known structure.

In the spaces between this vertical CCD 31 and the photodetector according to the present invention which includes the photoelectric transducer 20, the shift gate 34 is provided as described above in order to start and stop the transfer of charge. Among the electron-hole pairs generated within the photodetector of the present invention due to illumination with light, the holes accumulate in the central portion of the multiple quantum wire array, not shown in this figure, as described previously, thus controlling the electron flow due to majority electrons supplied from the source electrode 16. The controlled electron flow is accumulated in the charge accumulation region consisting of the Schottky electrode 33 from the widened area 22 (see FIG. 2) at either end of the quantum wires, and by controlling the voltage applied to the shift gate 34, the current is led to the vertical CCD 31 after a fixed amount of exposure.

In a silicon CCD imaging sensor, as is known, the vertical CCD 31 transfers electrons supplied from the photodetector of the present invention to a horizontal CCD 32 by means of a 2- to 4-phase charge transfer pulse, ultimately providing output of an image signal to a readout electrode 35. In this embodiment, the pulse train generation circuits and charge sense amplifiers required for CCD operation are assumed to use silicon integrated circuits constructed by existing known techniques, but they may also be fabricated by incorporating group III–V semiconductor integrated circuits which are made of the same materials. In addition, it is easy to assemble a one-dimensional, not two-dimensional, photodetector array and thus construct a line sensor that transmits photoexcited charge from there to the vertical CCD 31. If a GaAs-based CCD is used, its superior high speed permits an ultra-high speed camera with a frame rate of $\frac{1}{1000}$ second or less to be realized.

As described above, in the case that light is incident upon the substrate in the direction perpendicular to the flat surface (perpendicular incidence), in order to secure an adequate light absorption coefficient, the relatively thick lower and upper clad layers 11 and 14 must be used. In this case, the wavelength range is limited because of the need to form the quantum wire 12 used for the FET channel, so when constructing photodetectors for use in communications wavelength bands, it is preferable to use a photosensitive region (light absorption layer) that includes the quantum wire 12 and oblique quantum well layer 13. Pursuing this line of thinking, constructing a parallel or edge illuminated photodetector wherein light is incident in a direction parallel to the planar surface of the substrate, rather than perpendicular incidence, is a promising modification.

Figure 5:
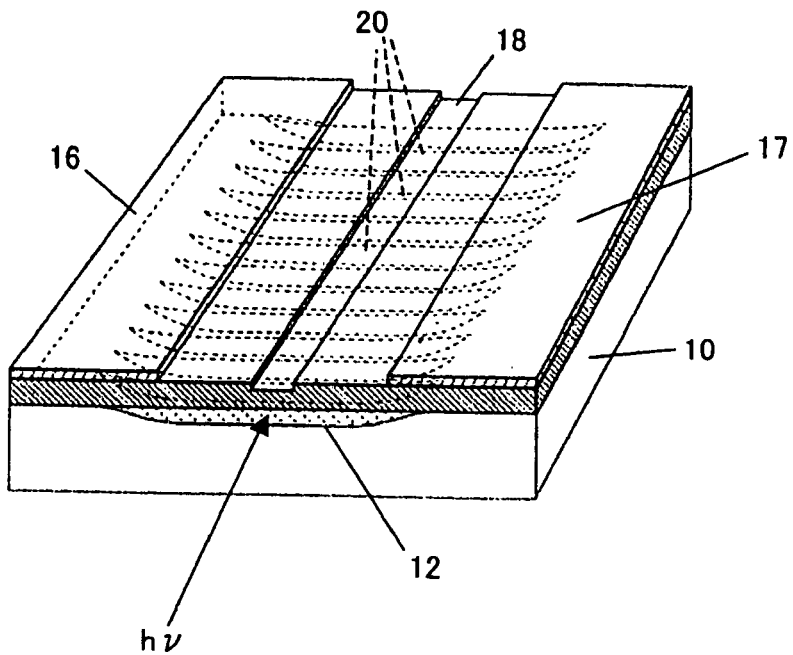
FIG. 5 is a schematic structural diagram of another embodiment of the photodetector according to the present invention.

FIG. 5 schematically presents an embodiment of the photodetector according to the present invention in this case. The quantum wires 12 of the photoelectric transducer 20 according to the present invention are arranged parallel to each other at high density and surrounded by a quantum well upon the substrate 10 between the source electrode 16 and drain electrode 17. The incident light hο is introduced from the end surface of the substrate 10. A light waveguide with a horizontal width of several microns can be formed due to the increase of the refractive index by the quantum wire 12. The length of the device may be set to roughly 100 μm, for example. By using a large number of quantum wires in this manner as a waveguide-type photodetector, it is possible to secure an adequate light absorption coefficient. In addition, wavelength selectivity can be obtained by disposing the quantum wires 12 to match the period of propagation of the light waveguide mode. To describe an example of fabrication in this case, wet etching is used to form a thin GaAs buffer on a V-grooved array substrate 10 which has (111)A oblique walls. An AlGaAs clad layer is formed at a deposition temperature at which the grating shape is maintained. Then, the quantum wires 12 are formed in the clad layer with the grating shape maintained. Specifically, a high-sensitivity photodetector can be fabricated by the same processes as that for a semiconductor laser, so it is possible to fabricate both a light source and photodetector with matched wavelength selectivity suited to wavelength-multiplexing communications applications, as a set upon the same substrate. Such a light source and photodetector set can also be used as an ultra-low power consumption photocoupler.

Figure 6:
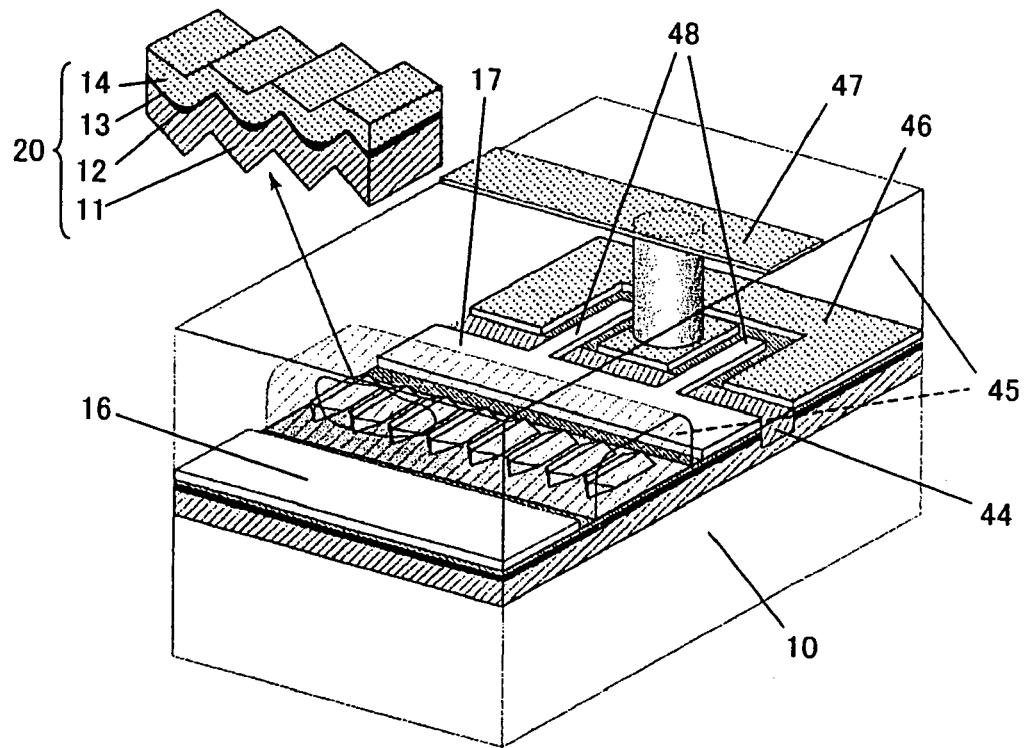
FIG. 6 is an explanatory diagram of an example of an OEIC structure that incorporates the photodetector according to the present invention.

Here follows a description of an example of incorporating the photodetector according to the present invention into an optoelectric integrated circuit (OEIC), made with reference to FIG. 6. In FIG. 6, a photoelectric transducer 20 according to the present invention is provided upon the substrate 10. Although the source electrode 16 is used exclusively for the photoelectric transducer 20, the drain electrode 17 is formed as a unit with the gate electrode 48 of an impedance conversion FET formed upon the substrate with an insulating film 44 interposed between. The source electrode 46 of the FET is formed so as to surround part of the gate electrode and also, the drain electrode 47 may penetrate a polyimide light waveguide 45 and be extended onto its upper surface. The photoelectric transducer 20 is naturally surrounded by the light waveguide 45.

By adopting such a structure, it is possible to further increase the response speed without lowering the sensitivity of the photodetector according to the present invention. In addition, when such a light waveguide structure is used, the light absorption region is not concentrated at a single point, so a linear response can be obtained even with respect to intense light input. When polyimide is used as the light waveguide 45 as described above, not only can this material be used as the insulating layer for multi-layer interconnection, but also it can be used as the dielectric insulating layer for the microwave strip line, so it is suited to a three-dimensional interconnecting structure, such as that shown in the figure.

When fabricating the photoelectric transducer according to the present invention, in the case that the quantum wire is made of InGaAs, for example, the In which has a low deposition rate in the oblique side walls will accumulate in the bottom of the V groove. In addition, in the case that the length of the quantum wire is on the same level as the surface migration distance of In, the central portion of the quantum wire becomes thicker and the energy band gap in this portion becomes narrower, so even if the recess 18 described previously is absent, it is still possible to achieve a structure wherein holes concentrate at one point within the quantum wire 12. In addition, when a quantum dot is formed in the interior of the quantum wire or adjacent to or connected to the quantum wire, an even more effective photodetector can be provided.

Figure 7:
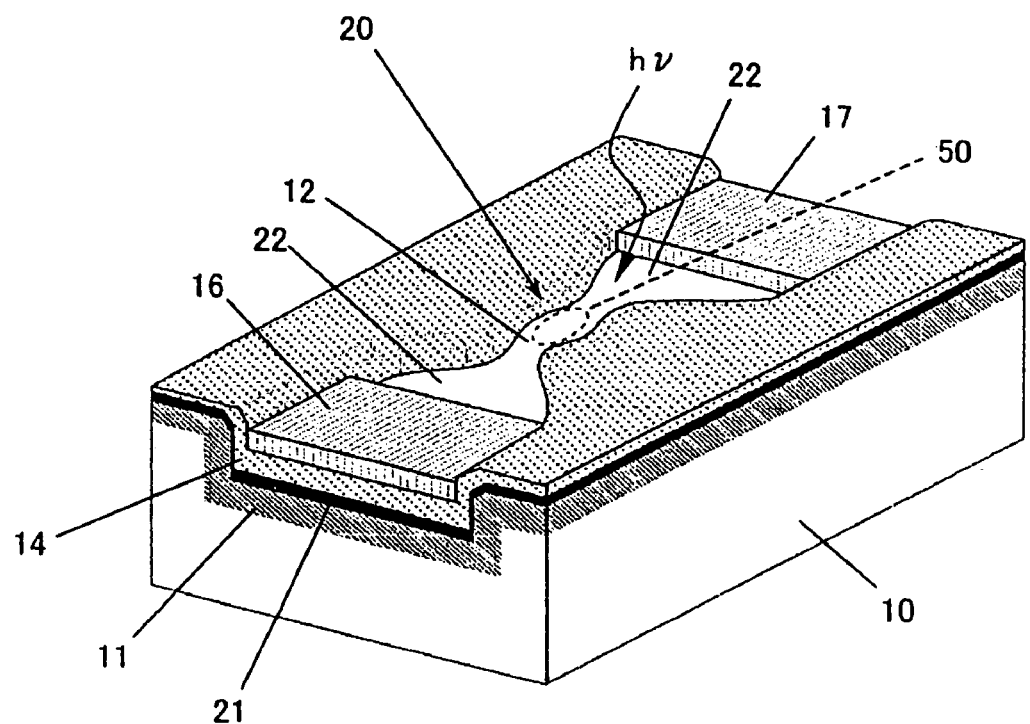
FIG. 7 is a schematic structural diagram of still another embodiment of the photodetector according to the present invention.

FIG. 7 schematically illustrates one embodiment of the effective photodetector described above. In a photoelectric transducer 20 like that described above, a quantum dot 50 of InGaAs, for example, is formed independently of the quantum wire channel 12 with a barrier interposed. While the method of formation itself is known, in fact the quantum dot is formed as a bump from one portion of a thin film (wet layer), but this may be formed upon the upper clad layer 14 or in its interior. In FIG. 7, the quantum dot 50 is schematically illustrated with dashed lines, such that it includes either case. With such a structure, the quantum dot 50 becomes an extremely effective photocarrier accumulation region, so a portion of the photogenerated holes accumulate at the quantum dot through the wet layer accompanying the formation of the quantum dot 50. The lifetime of the accumulated holes reaches from several milliseconds to several seconds. For this reason, as long as no accompanying reset mechanism is installed, it will become relatively low speed, but an extremely high-sensitivity photodetector that is suited to the detection of faint, long-wavelength light is achieved.

Note that if a quantum dot 50 is provided adjacent to the quantum wire 12 in this manner, then the quantum well layer 13 (see FIGS. 1–3) becomes unnecessary, but typically it is preferable to use a quantum well layer 13 connected to the quantum wire 12 and thus achieve even higher sensitivity.

Figure 8:
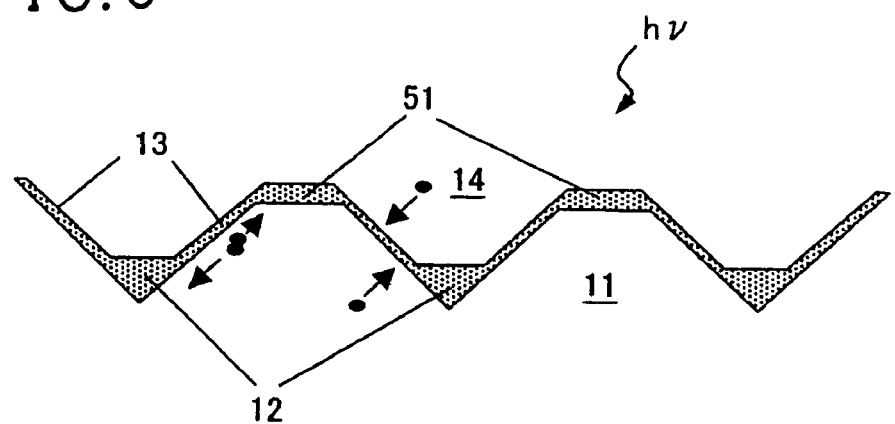
FIG. 8 is a schematic structural diagram of an enlargement of yet another embodiment of the photodetector according to the present invention.

Up until now, the quantum wire provided at least in the bottom of the V groove had been used for the entire channel or at least part of it, but a so-called ridge quantum wire that appears to be formed at the top of a ridgeline may also be used instead of, or in addition to, the quantum wire 12 at the bottom of the V groove. FIG. 8 schematically illustrates one example of only the channel portion and the side-wall quantum well layer 13. In this case, by providing a plurality of parallel V grooves to give a saw-tooth profile, quantum wires 12 are formed at the bottoms of the valleys on the saw-tooth lower clad layer and ridge quantum wires 51 are formed at the ridge portions, alternately in parallel. With this structure also, the structure of the embodiments described previously can also be adopted, so by incorporating this structure into a portion of the channel-length portion over the entire channel or at least a portion of the channel between the source and drain electrodes, again it is possible to provide a high-sensitivity, high-speed and low power consumption photodetector.

With the present invention, it is possible to provide a photodetector that has the ability to identify single photo-generated charges at room-temperature operation. Specifically, the photogenerated minority carriers accumulate at preferably one point in a conductive channel, and the majority carrier current flowing through the channel is modulated extremely efficiently, so a high-sensitive, high-speed photodetector can be achieved. In the quantum wire channel, the electron channel is constrained to one dimension, so it is possible for a single charge to block the current path and thus change the current flow through the device in a digital manner. While this is known as random telegram noise in quantum wires or single-electron transistors, with the structure according to the present invention, a function for concentrating photocarriers induced by the irradiation of light into a single point is also provided, so single photons can be detected with high efficiency. In addition, when a quantum dot is formed in the interior of the quantum wire or at a position adjacent to or connecting to the quantum wire, this quantum dot has very small parasitic capacitance, so it is also suited to application as a single photon emitter based on the alternating injection of electrons and holes.

In addition, with the device according to the present invention, the photosensitive region is separated from the FET portion including the quantum wire channel which has the charge amplification function, so it is possible to optimize the functions of each of these portions. Specifically, the FET channel length or channel width can be reduced independently of the photosensitive portion, so ultra-high-speed and high-sensitive detection of photocarriers becomes possible. In addition, the photosensitive region and FET are connected in a single device, so the structure is such that it is resistant to the effects of exogenous noise. Cooling to an appropriate temperature would extend the recombination lifetime of photogenerated electron-hole pairs and be an advantage in the detection of weak optical signals. At the same time, it permits the low-temperature operation of the FET as an active device, so the structure is suited to being effective in improving the performance as an ultra-high-sensitivity photodetector.

Moreover, in short, the invention provides a structural principle wherein the quantum wire channel, the upper and lower clad layers, quantum well layers and other core portions can be formed by one-time selective growth, so there is no risk of crystal defects arising at the interface as in JP-A HEI 9-260711 described previously. In addition, the present invention provides a constitution wherein the quantum wire channel is essentially provided only in the current control region and wherein both of its ends at the source and drain side are connected to the source and drain region, respectively, via a widened quantum well layer. If this constitution is followed, then the parasitic capacitance and resistance of the device is reduced further, thus contributing to increasing the speed of the device and lowering its power consumption.

In addition to the above, if the photocarrier accumulation region is provided upon a position that affects the quantum wire channel, and further if a metal gate electrode or transparent gate electrode or doped-layer electrode is provided in accordance with the normal FET structure, then it is possible to adjust the sensitivity and decrease the dark current depending on the potential applied thereto.

Ultimately, the device according to the present invention can be said to be a device of a structure wherein the photodetector and charge sensor are combined into a single unit by means of a three-dimensional quantum nanostructure. It can be used as an ultra-high-sensitivity photodetector not only for visible light but also in the long-wavelength range at 1 $\mu$m to 1.6 $\mu$m, and naturally it can be incorporated into arrays. Moreover, in certain cases, by forming the quantum wire channel near the surface of the device, it can also be adapted to a spectra range from the visible region to the ultraviolet region (~0.25 $\mu$m). In addition, its high sensitivity permits it to operate as a single-photon detector. In optical communications applications also, there is demand for reducing the optical input level required in subscriber systems, so where no photodetector had existed that achieved a high speed of 1 GHz or greater with high sensitivity in the long-wavelength band, the device according to the present invention can make this possible.

What is claimed is:

1. A photodetector comprising:
   quantum wire formed on a bottom of a V-shaped groove in a V-grooved substrate as a channel between source and drain electrodes, or as at least part of said channel;
   a photosensitive region comprising at least a clad layer that covers the quantum wire; and
   a photocarrier accumulation region provided within the quantum wire or at a position connected to or adjacent to the quantum wire for accumulating charges generated when light shines onto the photosensitive region.

2. The photodetector according to claim 1, wherein said photosensitive region comprises said clad layer, a quantum well layer provided along an oblique surface of said V-shaped groove and in contact with said quantum wire on both sides of said quantum wire, and said quantum wire.

3. The photodetector according to claim 2, wherein said clad layer comprises an upper clad layer upon said quantum well layer, which upper clad layer includes a recess provided therein between said source electrode and said drain electrode.

4. The photodetector according to claim 1, wherein said photocarrier accumulation region comprises a quantum dot provided in an interior of said quantum wire or at a position connected to or adjacent to said quantum wire.

5. The photodetector according to claim 1, wherein said quantum wire comprises:
   only a portion of said channel between the source and drain electrodes; and
   a portion between one end of said quantum wire and said source electrode and a portion between another end of said quantum wire and said drain electrode comprises a flat quantum well layer, wherein each end of said quantum wire gradually widens and comiects to the quantum well layer.

6. The photodetector according to any one of claims 1 to 5, wherein said quantum wire is a ridge quantum wire that is used in addition to, said quantum wire formed at the bottom of the V-shaped groove.

* * * * *